(12) United States Patent
Yoo

(10) Patent No.: US 10,586,829 B2
(45) Date of Patent: Mar. 10, 2020

(54) FULL-COLOR MONOLITHIC MICRO-LED PIXELS

(71) Applicant: Light Share, LLC, San Francisco, CA (US)

(72) Inventor: Myung Cheol Yoo, San Francisco, CA (US)

( * ) Notice: Subject to any disclaimer, the term of this patent is extended or adjusted under 35 U.S.C. 154(b) by 0 days.

(21) Appl. No.: 16/255,796

(22) Filed: Jan. 23, 2019

(65) Prior Publication Data
US 2019/0229149 A1 Jul. 25, 2019

Related U.S. Application Data

(60) Provisional application No. 62/620,660, filed on Jan. 23, 2018.

(51) Int. Cl.
| | |
|---|---|
| *H01L 27/15* | (2006.01) |
| *H01L 33/06* | (2010.01) |
| *H01L 33/30* | (2010.01) |
| *H01L 33/32* | (2010.01) |
| *H01L 33/38* | (2010.01) |
| *H01L 33/40* | (2010.01) |
| *H01L 33/62* | (2010.01) |
| *H01L 33/00* | (2010.01) |
| *H01L 33/44* | (2010.01) |

(52) U.S. Cl.
CPC .......... *H01L 27/156* (2013.01); *H01L 33/007* (2013.01); *H01L 33/0079* (2013.01); *H01L 33/06* (2013.01); *H01L 33/30* (2013.01); *H01L 33/32* (2013.01); *H01L 33/382* (2013.01); *H01L 33/405* (2013.01); *H01L 33/44* (2013.01); *H01L 33/62* (2013.01); *H01L 2933/0016* (2013.01); *H01L 2933/0025* (2013.01); *H01L 2933/0066* (2013.01)

(58) Field of Classification Search
CPC . H01L 27/156; H01L 33/007; H01L 33/0079; H01L 33/06; H01L 33/30; H01L 33/32; H01L 33/382; H01L 33/405; H01L 33/44; H01L 33/62
See application file for complete search history.

(56) References Cited

U.S. PATENT DOCUMENTS

| | | | | |
|---|---|---|---|---|
| 2006/0231852 A1* | 10/2006 | Kususe | ................. | H01L 24/06 257/99 |
| 2011/0101414 A1* | 5/2011 | Thompson | .............. | H01L 33/14 257/103 |
| 2011/0140137 A1* | 6/2011 | Lai | ...................... | H01L 25/0753 257/89 |
| 2015/0333241 A1* | 11/2015 | Chen | ..................... | H01L 33/62 257/93 |
| 2016/0276526 A1* | 9/2016 | Kaga | ...................... | H01L 27/156 |
| 2017/0012175 A1* | 1/2017 | Wang | ...................... | H01L 33/46 |
| 2018/0074372 A1* | 3/2018 | Takeya | ............... | G02F 1/133514 |
| 2019/0088633 A1* | 3/2019 | Tao | ......................... | H01L 25/167 |
| 2019/0140017 A1* | 5/2019 | Chen | ..................... | H01L 27/156 |
| 2019/0198562 A1* | 6/2019 | Schubert | ............... | H01L 21/308 |

* cited by examiner

*Primary Examiner* — Nathan W Ha

(57) ABSTRACT

Monolithic pixels are implemented by laterally disposed green, blue and red micro-LED sub-pixels separated by dielectric sidewalls. The green and blue sub-pixels are formed with nitride-based material layers while the red sub-pixel is formed with non-nitride-based material layers that yield an optically-efficient red sub-pixel that is intensity-balanced with the green and blue sub-pixels.

10 Claims, 4 Drawing Sheets

FULL-COLOR MONOLITHIC MICRO-LED PIXELS

CROSS-REFERENCE TO RELATED APPLICATIONS

This application hereby claims priority to and incorporates by reference U.S. provisional application No. 62/620,660 filed Jan. 23, 2018.

TECHNICAL FIELD

The disclosure herein relates to small-scale light-emitting-diode (LED) technology, and more particularly to micro-LEDs for application within viewable displays.

BACKGROUND

The exceedingly small chip size (generally <100 μm) that makes micro-LED technology so promising for next-generation displays also raises a major commercialization hurdle: how to transfer millions or tens of millions of the tiny chips expediently and precisely to their operating destinations within a display infrastructure. Even with state-of-the art pick-and-place or roll transfer techniques, placement of many millions of individual red, green and blue micro-LED sub-pixel chips at pixel sites smaller by a factor of 1,000 or more than those of conventional ~1 mm pixels remains slow and error prone, driving production time and cost prohibitively high. The various monolithic and compositing approaches proposed to date, including vertical RGB epitaxy (monolithic vertical stack of red, green and blue InGaN multi-quantum wells), wafer bonding (red, green and blue micro-LED wafers bonded together to form a composite vertical RGB stack), nano-wire RGB epitaxy (blue, green and red InGaN nano-wire epitaxy) and quantum-dot-coated nano-wire (QD-coated blue GaN nano-wire epitaxy), are generally plagued by low output intensity (particularly in the light-blocking vertical-stack approaches), uneven color mixing due (e.g., to low efficiency, wavelength variation and/or difficult process control, particularly in red pixels), or both.

DRAWING

The various embodiments disclosed herein are illustrated by way of example, and not by way of limitation, in the figures of the accompanying drawings and in which like reference numerals refer to similar elements and in which.

DETAILED DESCRIPTION

Monolithic pixels having laterally arranged micro-LED sub-pixels formed from heterogeneous red and blue/green material stacks are disclosed herein in various embodiments together with processes for their wafer-integrated fabrication and post-production application. In a number of embodiments, the monolithic pixels are each constituted by red, green and blue sub-pixels formed alternately with nitride-based material layers (blue and green sub-pixels) and non-nitride-based material layers (red sub-pixel)—an approach that yields, with high process repeatability and control, an optically-efficient red sub-pixel that is intensity-balanced with counterpart green and blue sub-pixels all on the same wafer.

Figure 1:
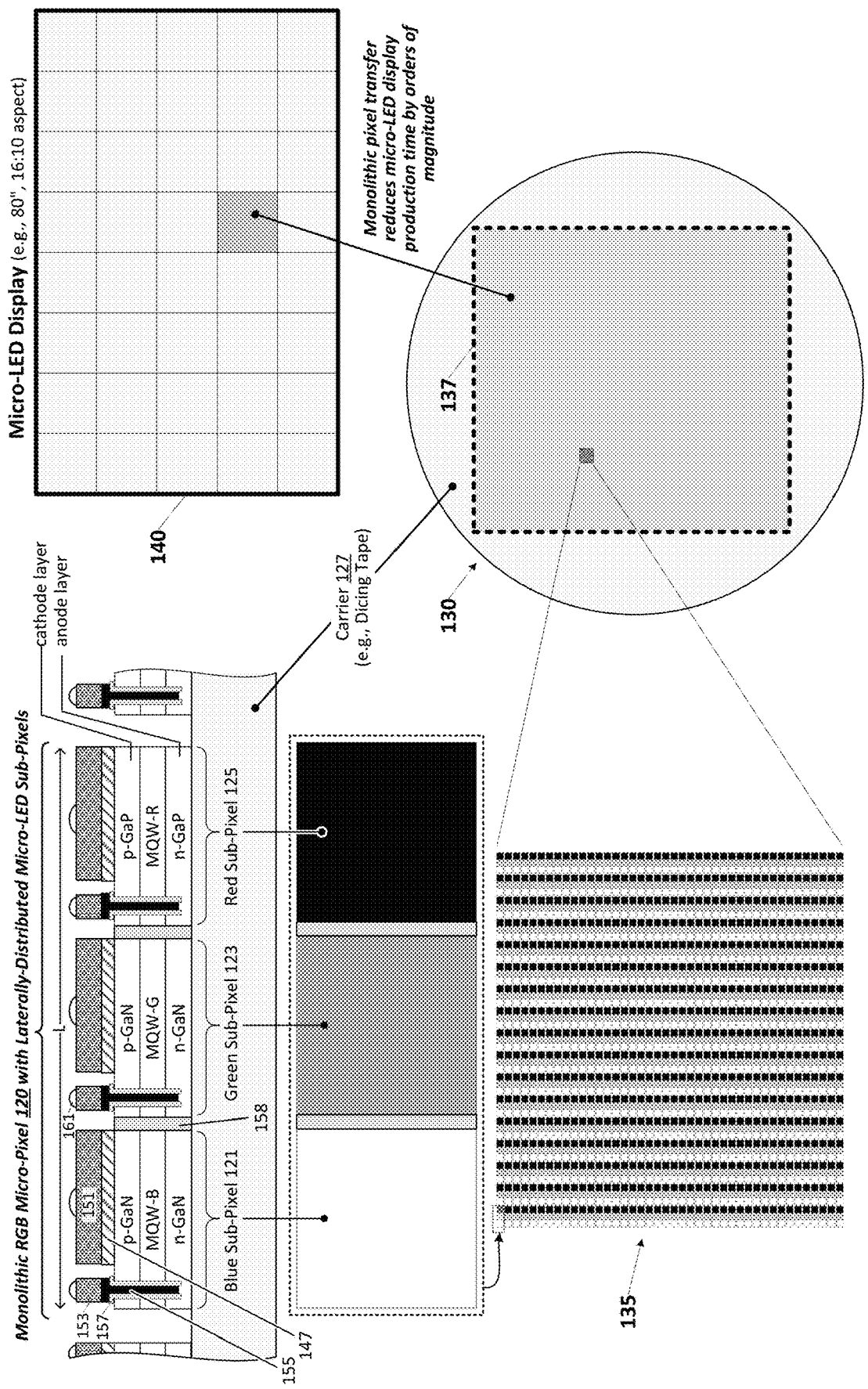
FIG. 1 illustrates a cross-sectional view of a monolithic, heterogeneous-stack micro-LED pixel.

FIG. 1 illustrates a cross-sectional view of a monolithic, heterogeneous-stack micro-LED pixel 120, referred to herein as a "hetero-stack micro-pixel" (or "micro-pixel" for short), having side-wall-isolated blue, green and red sub-pixels 121, 123 and 125 disposed emission-side down on a dicing tape (e.g., blue tape, UV-tape) or other temporary carrier 127. The lateral dimension (L) of the micro-pixel is generally less than 100 microns (μm) and, in a number of embodiments, between 5 and 50 microns, with sub-pixel dimensions being approximately 1-12 microns—a micro-pixel footprint approximately 100-1,000 times smaller than that of conventional LED pixels. As can be appreciated from wafer-view 130 and magnified section thereof at 135, micro-pixel 120 is one of many millions of micro-pixels disposed on the temporary carrier 127, preferably with a pixel-to-pixel spacing (i.e., distance between adjacent micro-pixels) that matches the pixel placement pitch within a display backplane—a dimensional correspondence that enables simultaneous transfer of many thousands, millions or tens of millions of micro-pixels from the carrier to a micro-pixel (or micro-LED) display. In FIG. 1, for example, all micro-pixels within the wafer-scale footprint shown at 137 (which may encompass any polygonal area and is thus not limited to the quadrilateral area shown) are simultaneously transferred (i.e., moved in a single operation) to a corresponding region within a wide-screen display 140 (80-inch display with 16:10 aspect ratio shown for purposes of example only). More generally, micro-pixels disposed within any region of the carrier 127 (including the entirety of the carrier) may be transferred to any of various types/sizes of displays including, for example and without limitation, near-eye displays (NEDs), virtual-reality (VR) displays, augmented-reality (AR) displays, flexible/wearable displays, smartphone or other mobile/handheld-device displays, tablet/computer displays, television displays of any size, billboard-sized (signage) displays, arena/stadium or other public-venue displays, and so forth.

Still referring to FIG. 1, the blue, green and red sub-pixels (121, 123, 125) each include a color-optimized multi-quantum-well (MQW-B, MQW-G, MQW-R) sandwiched between respective cathode and anode layers—nitride-based cathode/anode layers for the blue and green sub-pixels (e.g., p-type and n-type gallium nitride, GaN, respectively), and non-nitride cathode/anode layers for the red sub-pixel (i.e., material layers containing no or negligible quantities of nitrogen). In the specific embodiment shown, the red sub-pixel cathode and anode layers are implemented by p-type and n-type gallium phosphide (p-GaP and n-GaP), respectively, though p-type and n-type aluminum gallium arsenide (p-AlGaAs, n-AlGaAs) or other non-nitride semiconductor materials may be used instead. In yet other embodiments, red sub-pixels may include nitride-based material layers.

A light-reflection and seed layer (collectively 147) is disposed on the bottom of each micro-LED material stack (micro-LEDs are inverted in the cross-sectional view with the bottom p-type layer shown on top), and cathode/anode contacts 151, 153 are formed respectively over the seed/reflection layer and a conductive via 155 (extending to the anode layer and electrically isolated from the cathode layer and MQW by via-isolation oxide 157). By this arrangement, a forward bias potential applied between the cathode and anode contacts for a given sub-pixel will produce electroluminescence (electron-hole recombination) within the corresponding multi-quantum-well and thus light emission. The bottom reflective layer and silicon oxide or silicon nitride sidewalls 158 (e.g., $SiO_2$ or $SiN_X$) redirect light toward the pixel surface (the carrier-side surface of the anode material layers) for enhanced surface light emission. Contact bumps or balls 161 enable one-step (i.e., solder reflow step) electrical contact and physical joining of the micro-pixels to a rigid or flexible display backplane.

Figure 2:
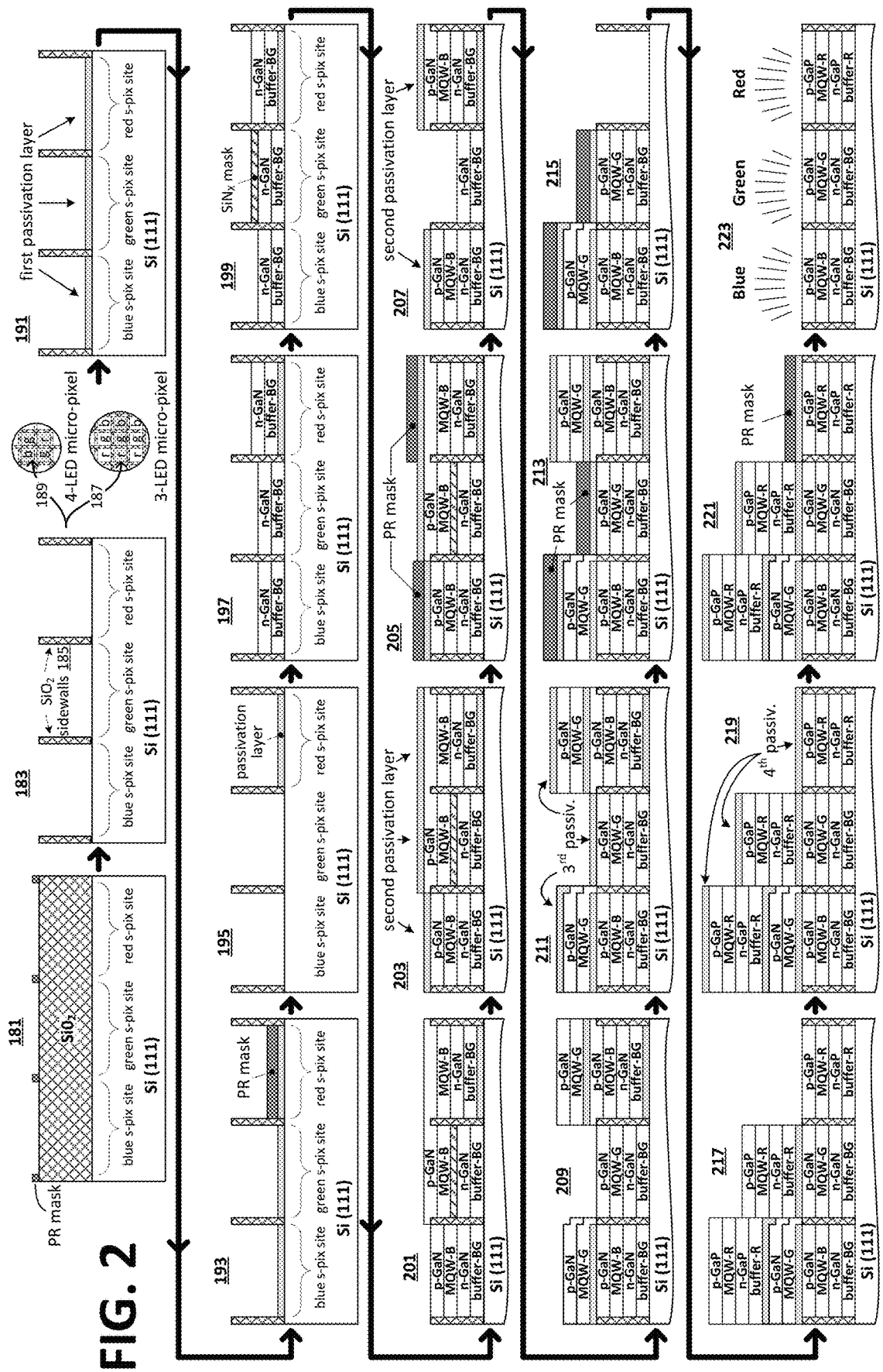
FIGS. 2 and 3 illustrate exemplary fabrication processes for the heterogeneous-stack micro-pixels shown in FIG. 1, in both cases forming the heterogeneous material stacks through epitaxial growth on a single-crystal silicon substrate or wafer.
Figure 3:
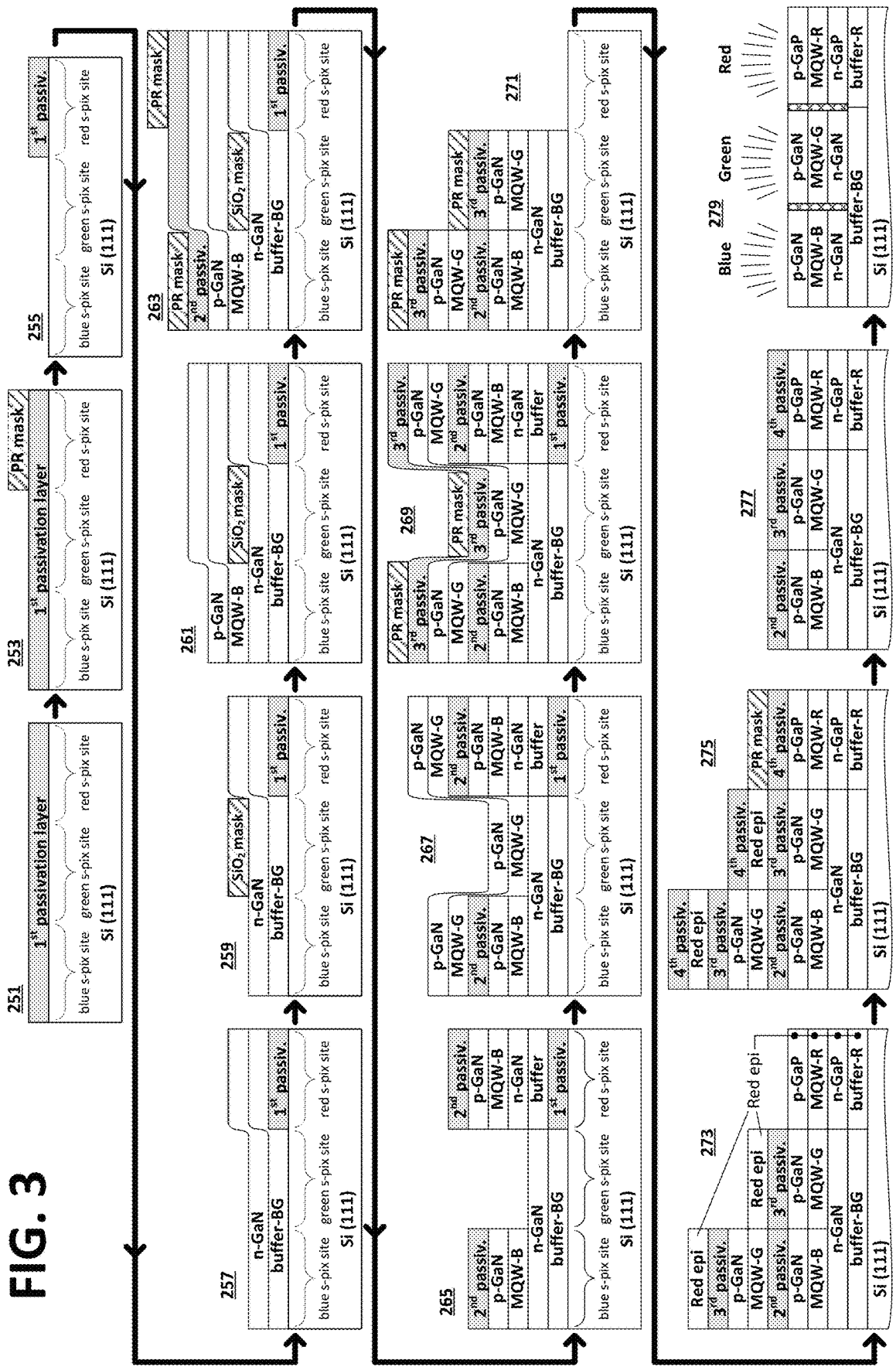

FIGS. 2 and 3 illustrate exemplary fabrication processes for the hetero-stack micro-pixels shown in FIG. 1, in both cases forming the heterogeneous material stacks (nitride-based and non-nitride based material stacks for blue/green and red sub-pixels, respectively) through epitaxial growth on single-crystal silicon. In the particular embodiment shown, the bulk silicon crystal is grown and/or cut to yield a (111) silicon substrate (i.e., surface cut at diagonal to all three axes of the crystal lattice)—a crystallographic orientation that improves overall planarity and stability of subsequent heterogenous buffer layers formed thereon to support epitaxial growth of the disparate red and green/blue material stacks.

Referring first to FIG. 2, a layer of silicon oxide (i.e., silicon dioxide, $SiO_2$) is formed over the silicon substrate followed by patterning of a side-wall masking layer (photoresist, in this example, is deposited, masked, exposed and cleared) to leave the masking arrangement shown at 181. At 183, the unmasked silicon oxide is etched (with photoresist mask cleared thereafter), leaving isolation sidewalls 184 between red, green and blue (RGB) sub-pixel sites, as well as oxide streetlines between adjacent micro-pixel sites. For ease of illustration, micro-pixels are depicted within the various drawing figures herein as having three laterally disposed sub-pixel constituents (red, green and blue) as shown in shaded region of the top-view 187. The sub-pixels may be arranged in any color order within the micro-pixel (the color-order being uniform or spatially varying as between any two micro-pixels) and micro-pixels themselves may be spatially arranged to yield color adjacency (e.g., as shown at 187 with red, green and blue sub-pixels forming distinct columns) or color offset. In all cases, micro-pixels may encompass four or more sub-pixels in any practicable configuration and color ratio (see four sub-pixel Bayer-pattern arrangement at 189, for instance—a micro-pixel having two green sub-pixels per red sub-pixel and blue sub-pixel) and may have any micro-pixel to micro-pixel alignment. Also, while sub-pixels are generally described and depicted herein as being square, sub-pixels may have light-emitting surfaces with any practicable polygonal geometry (quadrilateral, pentagonal, hexagonal, octagonal, etc.) or contoured geometry (i.e., circular, ellipsoidal, etc.).

Still referring to FIG. 2, a first passivation layer is deposited or grown on all sub-pixel sites at 191, followed by mask deposition on the red sub-pixel site as shown at 193 (e.g., photoresist deposited over the entire wafer, then selective exposure to leave photoresist mask only at red sub-pixel sites). Thereafter, unmasked passivation material at blue and green sub-pixel sites is etched away, followed by photoresist mask removal from the red sub-pixel site to yield the configuration at 195—that is, first passivation layer over red sub-pixel site, with exposed silicon substrate at blue and green sub-pixel sites. In general the first passivation layer and subsequent passivation layers described below are formed from silicon nitride ($SiN_X$) to enable their eventual removal without disrupting the silicon dioxide sidewalls. In alternative processes, the passivation layers may be silicon dioxide and the isolation sidewalls formed from silicon nitride. Other sidewall/passivation material combinations may also be used.

Proceeding from the structure at 195, buffer layers optimized for nitride epitaxy are deposited or grown over the wafer, followed by wafer-wide epitaxial growth of n-type gallium nitride (n-GaN) to yield the arrangement shown at 197. A silicon nitride mask is deposited selectively deposited or grown at the green sub-pixel site as shown at 199 (e.g., through wafer-wide $SiN_X$ deposition/growth, followed by masking at green sub-pixel site and etching away of unmasked silicon nitride from red and blue sub-pixel sites), followed by wafer-wide formation of blue-optimized multi-quantum-wells (MQW-B) and then wafer-wide formation of p-type gallium nitride (p-GaN) to yield the structure shown at 201. At this point, the blue sub-pixel material stack is complete, with the n-GaN and p-GaN layers forming the micro-LED anode and cathode, respectively, and the blue-optimized multi-quantum-well (MQW-B) forming the active layer of the LED.

At 203 (still FIG. 2), a second wafer-wide passivation layer is deposited or grown and then masked at the blue and red-subpixel sites (205), exposing the second passivation layer at the green sub-pixel site. The exposed passivation layer (at the green sub-pixel site) is etched away along with the underlying p-GaN and MQW-B layers (one or more etching operations), followed by removal (etching away) of the silicon nitride layer from the green sub-pixel site and removal of the red/blue passivation masks, yielding a structure (207) ready for green sub-pixel formation. At this point, green-optimized multi-quantum-wells (MQW-G) are formed over the wafer followed by wafer-wide formation of p-type gallium nitride (p-GaN), completing the green sub-pixel as shown at 209. A third passivation layer is deposited at 211 to protect the green sub-pixel, followed by patterned masking of the green and blue sub-pixel sites to expose the third passivation layer exclusively at the red sub-pixel site as shown at 213. The material layers stacked in the unmasked red sub-pixel site are etched away entirely at 215, exposing the (111) silicon substrate at that site and thus making way for epitaxial growth of a red-optimized micro-LED material stack.

Still referring to FIG. 2 and proceeding from the structure at 215, a buffer material optimized for red sub-pixel epitaxy (i.e., "buffer-R") is formed over the wafer (and thus at the exposed silicon substrate), followed by wafer-wide deposition and/or growth of red-optimized anode, multi-quantum-well (MQW-R) and cathode layers to produce the arrangement at 217—that is, a completed red sub-pixel having non-nitride cathode, multi-quantum-well and anode layers on the same wafer as nitride-based green and blue sub-pixels. As discussed above, the non-nitride anode and cathode material layers may alternatively be implemented by p-type and n-type aluminum gallium arsenide (p-AlGaAs and n-AlGaAs) with corresponding changes in the red-optimized buffer and multi-quantum-well materials.

To finalize the hetero micro-pixel structure, a fourth passivation layer is formed wafer-wide as shown at 219, and then selectively masked at the red-pixel site as shown at 221. Thereafter, a multi-step process is carried out to etch the unmasked material stacks in the green and blue sub-pixel sites down to the second passivation and third layers, respectively. In one embodiment, for example, layers above the p-GaN layer of blue sub-pixel site and above the n-GaP layer of the green sub-pixel site are dry etched, followed by removal of the last layers of MQW-G and buffer-R above the second and third passivation layers in the blue and green sites, respectively, through chemical etch (e.g., $H_3PO_4$) that does not attack the passivation layers above the blue and green sub-pixel cathode layers. After etching down to the second and third passivation layers above the blue and green sub-pixel sites, the mask layer is stripped from the red sub-pixel site, followed by wafer-wide removal of the final passivation layers—that is, removing the second passivation layer from above the blue sub-pixels, removing the third passivation layer from above the green sub-pixels and removing the fourth passivation layer from above the red sub-pixels. The resulting wafer structure is shown at 223—monolithic, laterally disposed micro-LED sub-pixels having phosphide-based (or non-nitride) red and nitride-based blue/green material stacks.

Reflecting on the LED material stacks within the finalized epitaxial structure, AlN and AlGaN buffer layers may be used for the blue and green sub-pixels, while non-nitride buffer layers (e.g., GaAs) are used for the red sub-pixel. In a number of process embodiments, two-step and modulation growth methods are employed to control the nucleation process of GaAs on the (111) silicon substrate within the red sub-pixel sites—an approach that grows substantially planar, low-defect two dimensional buffer layers instead of the high-defect three dimensional (i.e., textured-surface rather than planar) buffer layers that typically result from conventional GaAs on silicon epitaxy. The improved red-site buffer layer (i.e., improved planarity with reduced defect count) in turn enables successful epitaxial growth of high-quality red micro-LED structures.

As with the cathode and anode layers, nitride-based materials are used to grow the multi-quantum wells for the green and blue sub-pixels (e.g., InGaN for well layers and GaN for barrier layers), while non-nitride materials are used to grow the multi-quantum-well for the red sub-pixel (e.g., $(AlIn)_xGa_{1-x}P$ for well layers and $(AlIn)_yGa_{1-y}P$ for barrier layers, where x is generally less than y).

The micro-pixel fabrication process shown in FIG. 3 is similar to that of FIG. 2, but lacks pre-formation of sub-pixel isolation sidewalls—features that may be implemented after sub-pixel epitaxy. Starting at 251, an initial passivation layer is formed over the (111) silicon substrate, selectively masked at the red sub-pixel site as shown at 253 and then etched away (followed by mask removal) to yield the configuration shown at 255. At 257, blue/green-optimized buffer layers are grown wafer-wide (thus establishing a planarized nitride-optimized buffer layer on the exposed (111) silicon—a buffer layer that also covers the passivation layer at the red sub-pixel site at a different plane) followed by wafer-wide growth of nitride-based blue/green anode layer (n-GaN in this example). A silicon dioxide mask is patterned over the green sub-pixel site at 259, followed by wafer-wide epitaxial formation of a blue-optimized multi-quantum-well (MQW-B) and nitride-based cathode layer (e.g., p-GaN) as shown at 261. At this point, the blue sub-pixel LED material stack is fully formed.

At 263, a second passivation layer is grown or deposited over the wafer, followed by patterned masking (e.g., photoresist) of the blue and red sub-pixel sites to enable selective material layer removal at the green sub-pixel site as shown at 265—that is etching down to the nitride-based anode layer that is to be shared (at least temporarily) by the blue and green sub-pixels. At 267, a green-optimized multi-quantum-well layer is grown wafer-wide followed by wafer-wide growth of a nitride-based layer to form the green sub-pixel multi-quantum-well and cathode layers. The blue and green sub-pixel layer stacks are complete at this point, though it remains to electrically isolate either the blue/green cathode layers (the separately grown p-GaN layers in the embodiment shown), the shared anode layer or both so that the blue and green sub-pixels may be separately powered and controlled.

Still referring to FIG. 3, a third passivation layer is formed over the wafer at 269, followed by patterned masking of the green and blue sub-pixel sites, thus exposing the third passivation layer only at the red sub-pixel site. At 271, the unmasked material stack over the third sub-pixel site is etched away to expose the silicon substrate, followed by wafer-wide epitaxial growth of a red-optimized buffer layer (i.e., optimized to enable stable growth of epitaxial layers optimized for red light emission, including non-nitride anode and cathode layers), a phosphide-based red sub-pixel anode layer, a red sub-pixel multi-quantum-well (MQW-R) and a phosphide-based red sub-pixel cathode layer. The resulting arrangement is depicted at 273, with the red-optimized buffer, anode, MQW and cathode layers depicted in collective form as "Red epi" over the blue and green sub-pixel sites. The heterogenous blue, green and red sub-pixel material stacks are complete at this stage.

To finalize the micro-pixel structure, a fourth passivation layer is formed over the wafer, followed by selective masking over the red sub-pixel site as shown at 275. At this point the second, third and fourth passivation layers form a composite layer above the cathode layers of the blue, green and red sub-pixels, respectively. Accordingly, the unmasked material layers above the composite passivation layer (i.e., above the second passivation layer in the blue sub-pixel site and above the third passivation layer in the green sub-pixel site) are etched away, followed by removal of the masking material from the red sub-pixel site, resulting in the structure shown at 277. The composite passivation layer above the sub-pixel cathode layers is removed, followed by isolation sidewall formation (i.e., trench etching and oxide back-fill) to yield the wafer structure shown at 279—monolithic, laterally disposed micro-LED sub-pixels having phosphide-based (or non-nitride) red and nitride-based blue/green material stacks.

The following additional considerations and options may bear on the choice of materials and process steps described in reference to FIGS. 2 and 3:

- Materials chosen for passivation layer are generally selected from dielectric materials, such as silicon oxide ($SiO_2$) or silicon nitride ($SiN_X$) that can be withstand high temperature during the epitaxial growth and also, it can be withstand chemical attacks and plasma damages;
- Selected passivation materials are generally easy to remove by chemical etch
- Passivation materials may be grown or deposited (e.g., via plasma enhanced chemical vapor deposition (PECVD) or steam oxidation on silicon wafer;
- In order to prevent thermal damage, epitaxial growth of various material layers is generally carried out in order of descending-temperature process steps (i.e., starting with highest-temperature process step and concluding with lowest-temperature process step)
- In a number of embodiments, epitaxially growing various material layers in order of descending-temperature process steps involves growing blue sub-pixel LED material stack first (highest temperature), green sub-pixel LED material stack second (next-highest temperature) and red sub-pixel LED material stack last (lowest temperature);

In some fabrication process embodiments, after exposing the silicon (111) surface at the blue and green sub-pixel sites (e.g., as shown at 195 in FIG. 2 and at 255 in FIG. 3), residual or parasitic oxide (i.e., naturally occurring but undesired) on the silicon surface may be removed (e.g., through thermal desorbtion at 750° C. for 10 minutes under hydrogen and arsenic ambient);

shared blue/green buffer layers (buffer-BG as shown at 257 in FIG. 3) or sidewall-separated blue/green buffer layers (buffer-BG as shown at 197 in FIG. 2) may be implemented, for example and without limitation, by ~50 nm-thick AlN and AlGaN layers grown epitaxially on the Si (111) substrate;

shared n-GaN layers or sidewall isolated nGaN layers on the blue and green sub-pixel sites (as shown at 257 in FIG. 3 and at 197 in FIG. 2) may be epitaxially grown (e.g., to a thickness of 2~3 m) on AlN/AlGaN buffer layer with silicon (Si) dopant (e.g., with Si doping concentration of $10^{18}$~$10^{19}$/cm$^3$);

In a number of embodiments, the blue and green multi-quantum-wells are implemented by 30-period InGaN well layers and GaN barrier layers having, for example, ~3 nm barrier and ~2 nm well layers (Indium content in the InGaN ternary alloy may be, for example, 15~20% for blue sub-pixels and 20~25% for green sub-pixels (i.e., in the case of 520-nm wavelength green micro-LED));

Above the MQW layer, a ~150 nm-thick p-type GaN layer may be grown as a contact (cathode) layer (e.g., Mg doped p-GaN doping concentration is $10^{16}$~$10^{17}$/cm$^3$);

With reference layer removal to yield the structure at 265 in FIG. 3, the second passivation layer removal at 265 may be implemented by wet chemical etch, such as BOE or HF; the blue p-GaN and MQW layers may be removed by ICP RIE dry etch or wet etch with $H_3PO_4$; and the $SiO_2$ mask layer on the green sub-pixel removal by wet chemicals, such as BOE or HF;

With regard to layer removal prior to growing red sub-pixel epitaxial layers, HF wet etch may be used to remove passivation layers and ICP RIE (Inductively coupled reactive ion etch) dry etch may be used to remove GaN layers (alternatively, wet chemical etch with $H_3PO_4$ may be used);

Prior to red sub-pixel epitaxial growth (e.g., at 215 in FIG. 2 and at 271 in FIG. 3), oxide on the exposed silicon (111) surface may be removed (e.g., thermally desorbed under hydrogen ($H_2$) and arsine ($AsH_3$) ambient;

In a number of embodiments, red epitaxial layers are implemented with GaAs-based buffer layer on silicon (111) substrate (to form atomically smooth surface), followed by epitaxial growth of n-GaP, AlInGaP-based quaternary-compound-semiconductor MQW, and p-GaP, respectively, above the GaAs buffer layers; and AlInGaP may be grown on the entire wafer as part of the red sub-pixel MQW epitaxy (e.g., using metal-organic chemical vapor deposition (MOCVD)).

Figure 4:
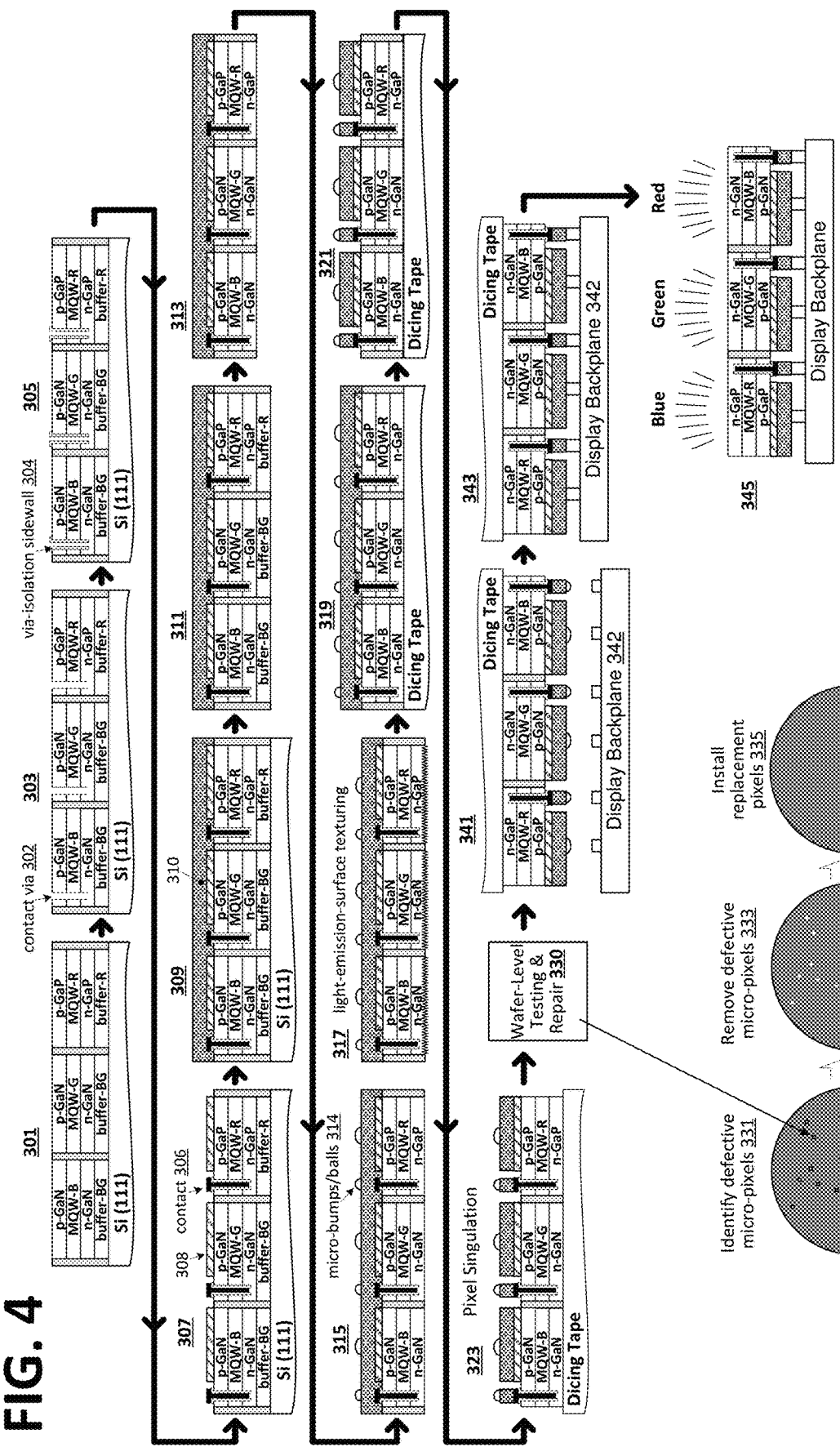
FIG. 4 illustrates an exemplary finishing sequence that may be carried out with respect to the hetero micro-pixel wafers discussed above.

FIG. 4 illustrates an exemplary finishing sequence that may be carried out with respect to the hetero micro-pixel wafers discussed above. Starting at 301 with a micro-pixel wafer implemented in accordance with the processes shown in FIG. 2 or 3, contact vias 302 are etched (masking followed by etching) down to the anode material layers within each of the blue, green and red sub-pixels (as shown at 303), and electrically-insulating/isolating sidewalls 304 are formed within each via trench as shown at 305. Electrical contacts 306 are formed within the vias as shown at 307, thus establishing isolated electrical contact to the anode layer within each sub-pixel (the insulating sidewall within each via electrically isolating the contact from the multi-quantum-well and cathode layers of the sub-pixels). Still referring to the structure at 307, an electrically conductive reflective layer and seed layer (shown collectively at 308) are formed one after the other over the cathode layers of the blue green and red sub-pixels—the reflective layer serving to re-direct incoming photons toward the LED surface (i.e., toward the anode layer) and the seed layer serving as a foundation for deposition of or electroplating with copper or other conductive material 310 to yield the structure shown at 309.

As the conductive material layer will maintain wafer structural integrity at this point, the silicon substrate may be etched away (to yield the structure at 311) followed by removal of the heterogenous buffer layers as shown at 313. At 315, Micro-balls or bumps or other electrical contact structures (314) are deposited on the conductive-material surface above strategic contact points for the anode and cathode layers of the blue, green and red sub-pixels. The light-emission surfaces of the sub-pixels (i.e., exposed surfaces of the heterogenous anode layers) are textured at 317 to improve light emission efficiency, followed by adherence of the light-emission surface to a carrier structure (as shown at 319), such as a dicing tape or the like (e.g., blue tape or UV tape). At 321, the conductive material layer is patterned and etched to form electrically-distinct positive and negative contacts to the cathode and anode material layers of respective sub-pixels. At 323, streetlines between neighboring micro-pixels are etched away to singulate the micro-pixels, relying on individual pixel adherence to the carrier structure to maintain wafer-level micro-pixel alignment. At this point, the micro-pixels are ready for pre-transfer testing/repair (330) and then transfer to a display backplane. Carrier structure expansion operations may be carried out as necessary to establish a micro-pixel pitch according to the contact-pitch within the destined backplane.

In one embodiment, as part of pre-transfer testing/repair operation 330, wafer-level probing (e.g., effecting photoluminescence by laser scanning, or by electrical probing/powering of individual micro-LEDs within the micro-pixel array) is carried out at 331 to identify and log the location/coordinates of defective micro-pixels, remove the defective micro-pixels (333) and replace the defective micro-pixels with known good micro-pixels (335). The replacement micro-pixels may be obtained from previous process runs (i.e., other micro-pixel wafers) or from peripheral or spare regions of the wafer under test/repair. In either case, after replacement of the defective micro-pixels, the wafer is ready for micro-pixel transfer. Accordingly, the wafer (or selected portions thereof) is aligned contact-to contact with a display backplane as shown at 341, followed by pressure and/or heat bonding of the adjoining contacts (343) and removal of the carrier to complete the transfer as shown at 345.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from or re-ordered relative to those described above. The term "coupled" is used herein to express a direct connection as well as a connection through one or more intervening circuits or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A multi-color monolithic pixel comprising:
   a first sub-pixel having a light-emitting diode (LED) material stack that (i) includes at least one nitride material layer and (ii) has a light emitting surface;
   a second sub-pixel having a LED material stack that (i) includes at least one non-nitride material layer not included in the LED material stack of the first sub-pixel and (ii) has a light emitting surface that is substantially coplanar with the light emitting surface of the LED material stack of the first sub-pixel; and
   a shared dielectric sidewall disposed between the LED material stacks of the first and second sub-pixels.

2. The multi-color monolithic pixel of claim 1 wherein the at least one non-nitride material layer comprises gallium phosphide.

3. The multi-color monolithic pixel of claim 1 wherein the at least one non-nitride material layer comprises aluminum gallium arsenide.

4. The multi-color monolithic pixel of claim 1 wherein the LED material stack of the second sub-pixel lacks contains no nitride material layers.

5. The multi-color monolithic pixel of claim 1 wherein the LED material stack of the first sub-pixel comprises an active layer that emits visible light predominantly in the blue spectrum, and LED material stack of the second sub-pixel comprises an active layer that emits visible light predominantly in the red spectrum.

6. The multi-color monolithic pixel of claim 5 further comprising a third sub-pixel having an LED material stack that (i) lacks the non-nitride material layer included in the LED material stack of the second pixel and (ii) includes at least one nitride layer and an active layer that emits visible light predominantly in the green spectrum.

7. The multi-color monolithic pixel of claim 1 wherein the LED material stacks of each of the first and second sub-pixels has a light emitting surface having a dimension less than 100 microns.

8. The multi-color monolithic pixel of claim 1 wherein the LED material stack of the first sub-pixel comprises an active layer disposed between gallium nitride anode and cathode layers, and wherein the LED material stack of the second sub-pixel comprises an active layer disposed between non-nitride anode and cathode layers.

9. The multi-color monolithic pixel of claim 8 wherein the non-nitride anode and cathode layers of the LED material stack of the second sub-pixel comprise at least one of gallium phosphide or aluminum gallium arsenide.

10. The multi-color monolithic pixel of claim 1 wherein the LED material stacks of the first and second sub-pixels are mounted side by side on a display backplane.

* * * * *